United States Patent
Ishikawa et al.

(10) Patent No.: US 7,943,974 B2
(45) Date of Patent: May 17, 2011

(54) SPIN MOS FIELD EFFECT TRANSISTOR AND TUNNELING MAGNETORESISTIVE EFFECT ELEMENT USING STACK HAVING HEUSLER ALLOY

(75) Inventors: Mizue Ishikawa, Yokohama (JP); Yoshiaki Saito, Kawasaki (JP); Hideyuki Sugiyama, Kawasaki (JP); Tomoaki Inokuchi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 13 days.

(21) Appl. No.: 12/662,100

(22) Filed: Mar. 31, 2010

(65) Prior Publication Data
US 2010/0187585 A1    Jul. 29, 2010

Related U.S. Application Data

(62) Division of application No. 12/194,797, filed on Aug. 20, 2008, now Pat. No. 7,709,867.

(30) Foreign Application Priority Data

Aug. 24, 2007 (JP) ................... 2007-218963

(51) Int. Cl.
*H01L 29/76* (2006.01)
*H01L 29/94* (2006.01)
(52) U.S. Cl. ........... 257/289; 257/401; 257/E27.014
(58) Field of Classification Search .......... 257/289, 257/401, E27.014
See application file for complete search history.

(56) References Cited

U.S. PATENT DOCUMENTS

| | | | |
|---|---|---|---|
| 7,598,578 B2 | 10/2009 | Nakamura et al. | |
| 2007/0064342 A1 | 3/2007 | Nakamura et al. | |
| 2009/0057654 A1* | 3/2009 | Saito et al. | 257/39 |
| 2009/0180215 A1 | 7/2009 | Ishikawa et al. | |
| 2010/0090262 A1* | 4/2010 | Saito et al. | 257/295 |

FOREIGN PATENT DOCUMENTS

| JP | 2003-318465 | 11/2003 |
|---|---|---|
| JP | 2006-286726 | 10/2006 |
| JP | 2007-189039 | 7/2007 |

OTHER PUBLICATIONS

N.Tezuka, et al., "Structural dependence of the tunnel magnetoresistance for magnetic tunnel junctions with a full-Heusler $Co_2Fe$ (Al,Si) electrode", Journal of Applied Physics 99, 08T314, 2006, 3 pages.

Shinji Yuasa, et al., "Characterization of growth and crystallization processes in CoFeB/MgO/CoFeB magnetic tunnel junction structure by reflective high-energy electron diffraction", Applied Physics Letters 87, 242503, 2005, 3 pages.

* cited by examiner

*Primary Examiner* — Ngan Ngo
(74) *Attorney, Agent, or Firm* — Oblon, Spivak, McClelland, Maier & Neustadt, L.L.P.

(57) ABSTRACT

A spin MOS field effect transistor includes a source electrode and a drain electrode each having a structure obtained by stacking an impurity diffusion layer, a (001)-oriented MgO layer and a Heusler alloy. The impurity diffusion layer is formed in a surface region of a semiconductor layer. The (001)-oriented MgO layer is formed on the impurity diffusion layer. The Heusler alloy is formed on the MgO layer.

3 Claims, 13 Drawing Sheets
(2 of 13 Drawing Sheet(s) Filed in Color)

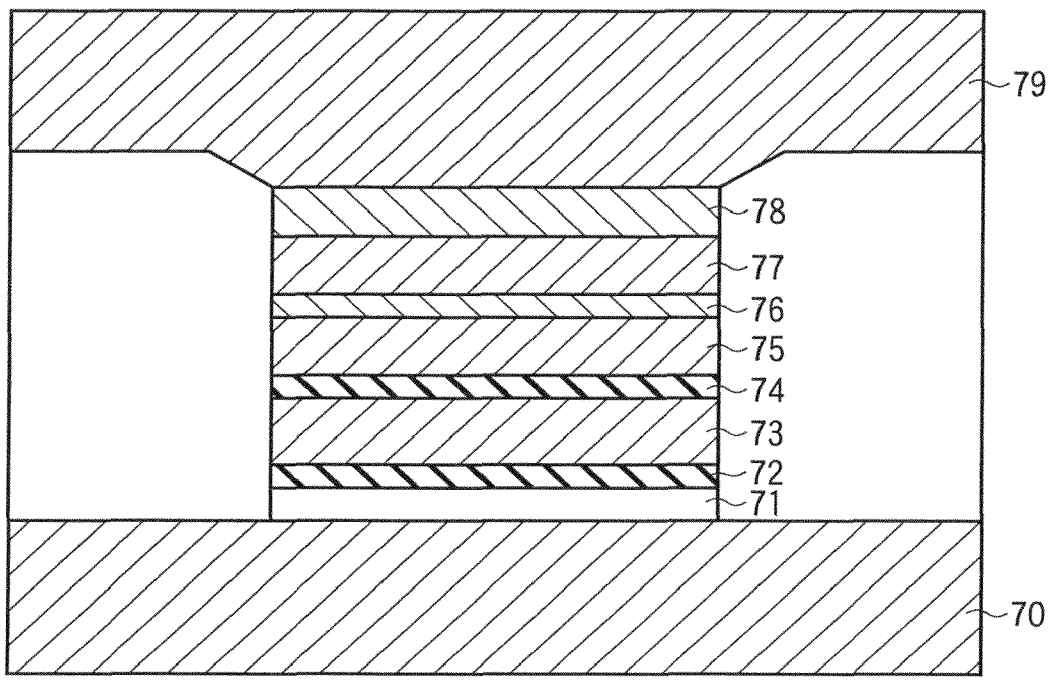
F I G. 18A
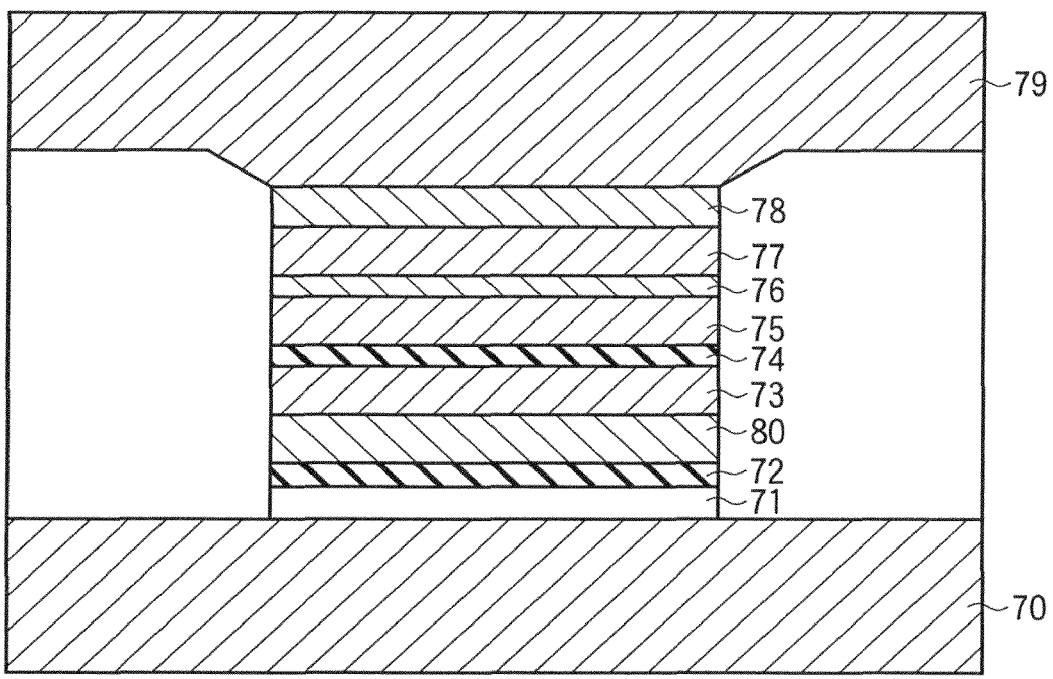
F I G. 18B

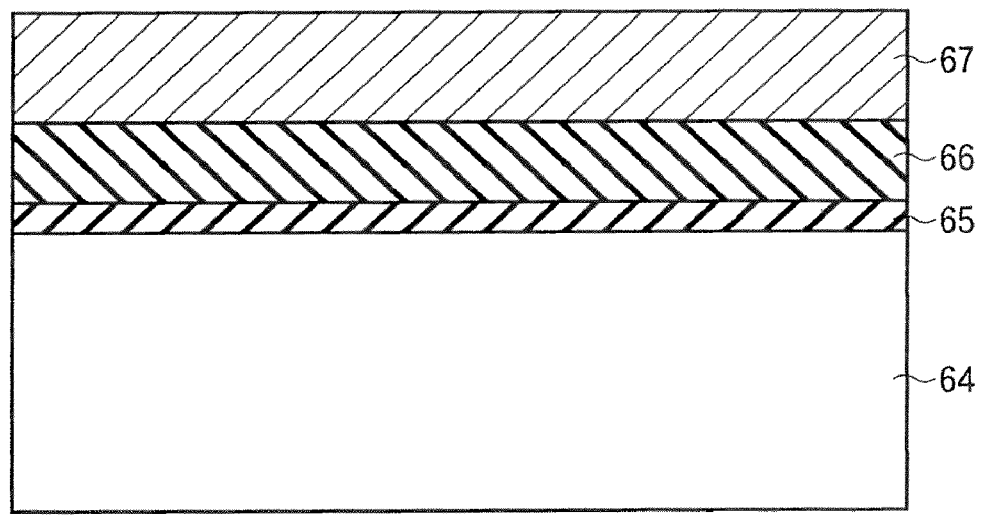
F I G. 19
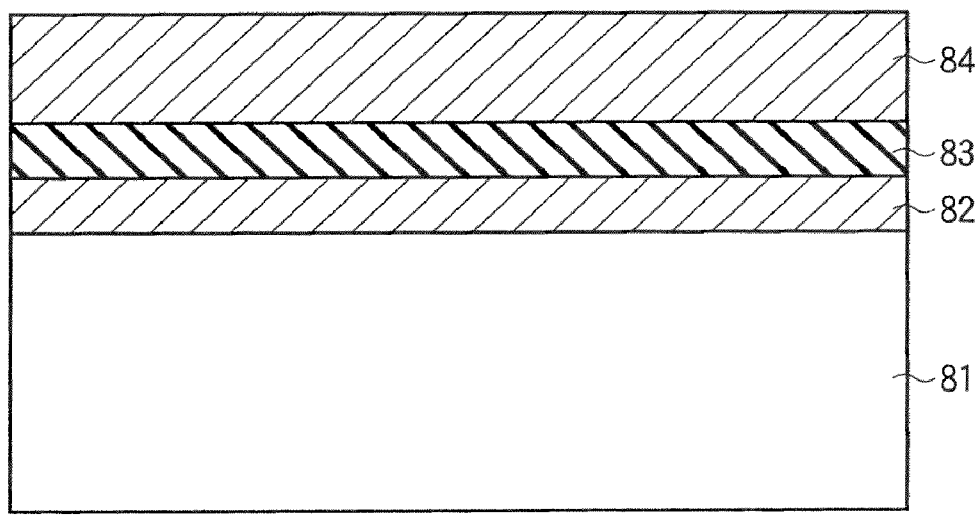
F I G. 21

SPIN MOS FIELD EFFECT TRANSISTOR AND TUNNELING MAGNETORESISTIVE EFFECT ELEMENT USING STACK HAVING HEUSLER ALLOY

CROSS-REFERENCE TO RELATED APPLICATIONS

This application is a divisional of and claims the benefit of priority under 35 U.S.C. §120 from U.S. application Ser. No. 12/194,797, filed Aug. 20, 2008, now U.S. Pat. No. 7,709,867 and claims the benefit of priority under 35 U.S.C. §119 from Japanese Patent Application No. 2007-218963, filed Aug. 24, 2007, the entire contents of each of which are incorporated herein by reference.

BACKGROUND OF THE INVENTION

1. Field of the Invention

The present invention relates to a semiconductor device using a stack having a Heusler alloy, e.g., a spin MOS field effect transistor using the stack having a Heusler alloy as the source/drain, magnetic memory, and tunneling magnetoresistive head (TMR head) using the stack.

2. Description of the Related Art

Recently, a magnetic memory (magnetic random access memory [MRAM]) using a tunneling magnetoresistive (TMR) effect element having a sandwiched structure including a ferromagnetic material/insulator/ferromagnetic material as a memory element has been proposed. This device is used as a memory by fixing spins in one ferromagnetic material layer (a pinned magnetic layer or a fixed layer), and controlling those in the other ferromagnetic material layer (a free magnetic layer), thereby changing the resistance between the two layers in the sandwiched structure. The resistance is low when the spins in the pinned magnetic layer and free magnetic layer are parallel, and high when they are antiparallel. The magnetoresistive change ratio (TMR ratio) as an index of this spin efficiency was a few 10% at room temperature a few years ago, but has reached 500% in recent years. This increases the possibility of the device not only as an MRAM but also as various spin devices. As an example, a spin MOS field effect transistor (spin MOSFET) has been proposed. The spin MOSFET is obtained by adding the degree of freedom of spins to carriers by combining a ferromagnetic material with the conventional MOSFET.

It is important to increase the TMR ratio in order to implement a high-efficiency magnetic memory or spin MOSFET. To this end, it is necessary to use a ferromagnetic material having a high spin polarization ratio (P). When a half-metallic material in which P=100% is used, the TMR ratio is presumably infinite from the Julliere's law. Candidates of a room-temperature, half-metal material are $CrO_2$, $Fe_3O_4$, and a Heusler alloy. Recently, Co-based Heusler alloys have achieved high TMR ratios, so spin devices using these alloys are expected. A Heusler alloy is a general term for intermetallic compounds having a chemical composition indicated by $X_2YZ$ where X is a Co-, Ni-, or Cu-based transition metal element or noble metal element in the periodic table, Y is an Mn-, V-, or Ti-based transition metal, and Z is a main group element of groups III to V.

To achieve a high TMR ratio by using a Heusler alloy, however, regular epitaxial growth of the crystal structure is indispensable when forming a stacked structure (e.g., N. Tezuka, et al., J. Appl. Phys. 99 (2006)08T314), and highly crystallized Heusler alloys are necessary in the spin device. Especially when using a Heusler alloy in the spin MOSFET, a technique of epitaxially growing a Heusler alloy on a semiconductor layer is indispensable.

Also, as prior art relevant to the present invention, a technique capable of forming a (001)-oriented MgO layer on an amorphous layer is disclosed (e.g., S. Yuasa, et al., Appl. Phys. Lett. 87 (2005)242503).

BRIEF SUMMARY OF THE INVENTION

According to a first aspect of the present invention, there is provided a spin MOS field effect transistor comprising a source electrode and a drain electrode each having a structure obtained by stacking: an impurity diffusion layer formed in a surface region of a semiconductor layer; a (001)-oriented MgO layer formed on the impurity diffusion layer; and a Heusler alloy formed on the MgO layer.

According to a second aspect of the present invention, there is provided a spin MOS field effect transistor comprising a source electrode and a drain electrode each having a structure obtained by stacking: a nonmagnetic metal amorphous layer formed on a semiconductor layer; a (001)-oriented MgO layer formed on the nonmagnetic metal amorphous layer; and a Heusler alloy formed on the MgO layer.

According to a third aspect of the present invention, there is provided a spin MOS field effect transistor comprising a source electrode and a drain electrode each having a structure obtained by stacking: an insulator amorphous layer formed on a semiconductor layer; a (001)-oriented MgO layer formed on the insulator amorphous layer; and a Heusler alloy formed on the MgO layer.

According to a fourth aspect of the present invention, there is provided a tunneling magnetoresistive effect element having a structure obtained by stacking: a nonmagnetic metal amorphous layer formed on an electrode layer; a (001)-oriented MgO layer formed on the nonmagnetic metal amorphous layer; and a Heusler alloy formed on the MgO layer.

According to a fifth aspect of the present invention, there is provided a tunneling magnetoresistive effect element having a structure obtained by stacking: an insulator amorphous layer formed on an electrode layer; a (001)-oriented MgO layer formed on the insulator amorphous layer; and a Heusler alloy formed on the MgO layer.

BRIEF DESCRIPTION OF THE SEVERAL VIEWS OF THE DRAWING

The file of this patent contains at least one photograph executed in color. Copies of this patent with color photographs will be provided by the Patent and Trademark Office upon request and payment of the necessary fee.

FIGS. 18A and 18B are sectional views each showing the structure of a TMR head of an eighth embodiment of the present invention;

FIG. 19 is a sectional view showing the structure of a stack having a Heusler alloy of Example 1 of the present invention;

FIG. 21 is a sectional view showing the structure of a stack having a Heusler alloy of Example 2 of the present invention.

DETAILED DESCRIPTION OF THE INVENTION

Figure 1:
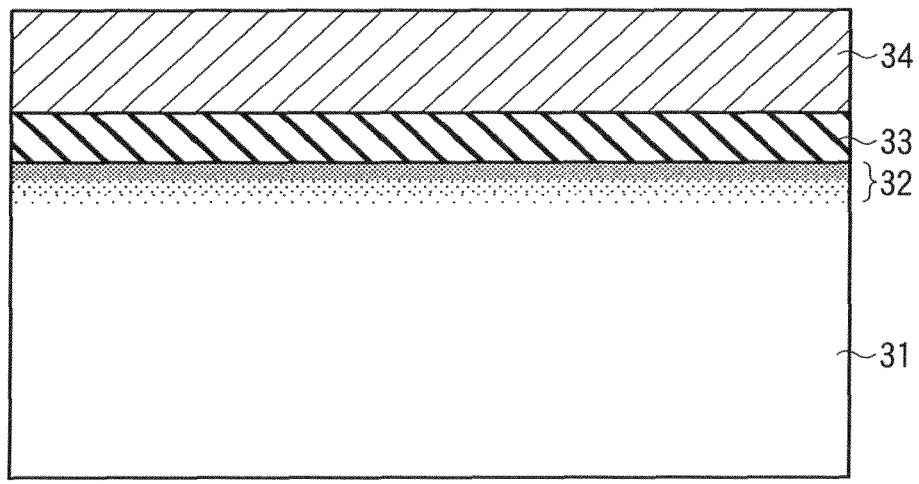
FIG. 1 is a sectional view showing the structure of a stack having a Heusler alloy of a first embodiment of the present invention.

Embodiments of the present invention will be explained below with reference to the accompanying drawing. In the following explanation, the same reference numerals denote the same parts throughout the drawing.

First Embodiment

First, a stack having a Heusler alloy of the first embodiment of the present invention will be explained below. FIG. 1 is a sectional view showing the structure of the stack having a Heusler alloy of the first embodiment.

As shown in FIG. 1, the stack of the first embodiment has a structure obtained by sequentially stacking an impurity diffusion layer 32 formed in the surface region of a semiconductor substrate 31 by ion implantation, a (001)-oriented MgO layer 33, and an epitaxially grown Heusler alloy 34. More specifically, the impurity diffusion layer 32 is formed in the surface region of the semiconductor substrate 31 by ion implantation. The (001)-oriented MgO layer 33 is formed on the impurity diffusion layer 32. The epitaxially grown Heusler alloy 34 is formed on the MgO layer 33. Note that the semiconductor substrate 31 is a substrate having an Si single crystal, Ge single crystal, or Si—Ge single crystal on at least the surface, or a silicon-on-insulator (SOI) substrate. A Heusler alloy is a general term for intermetallic compounds having a chemical composition indicated by $X_2YZ$ where X is a Co-, Ni-, or Cu-based transition metal element or noble metal element in the periodic table, Y is an Mn-, V-, or Ti-based transition metal, and Z is a main group element of groups III to V. Note also that ion implantation may also be performed by conventional ion milling using Ar or the like.

Next, the conditions of ion implantation for forming the impurity diffusion layer 32 on the semiconductor substrate 31 will be explained below. As an ion candidate to be substituted, it is possible to use, e.g., phosphorus (P), arsenic (As), or boron (B). The projection range of ion implantation is desirably 20 nm or less, and the acceleration voltage of ion implantation is desirably 20 keV or less. The carrier concentration in the impurity diffusion layer 32 is $10^{18}/cm^3$ to $10^{20}/cm^3$.

The annealing conditions will be explained below. As the annealing method, normal annealing or rapid thermal annealing (RTA) can be used. Annealing can be performed after the MgO layer 33 is formed, or after the Heusler alloy 34 is formed. Annealing is desirably performed after the MgO layer 33 is formed. When annealing is performed after the MgO layer 33 is formed, the crystallinity, i.e., the orientation of the MgO layer 33 improves. This makes it possible to further improve the crystallinity of the Heusler alloy 34.

In the stack of the first embodiment, when the impurity diffusion layer 32 is formed in the surface region of the semiconductor substrate 31 by ion implantation, the internal crystal structure of the impurity diffusion layer 32 is destroyed. When the MgO layer 33 is formed on the impurity diffusion layer 32 having the destroyed crystal structure, the MgO layer 33 grows as it is oriented in the (001) plane. A Heusler alloy is formed on the (001)-oriented MgO layer 33 by epitaxial growth. This makes it possible to form the epitaxially grown Heusler alloy 34 on the MgO layer 33, i.e., form the epitaxially grown Heusler alloy 34 on the semiconductor substrate 31.

Second Embodiment

Figure 2:
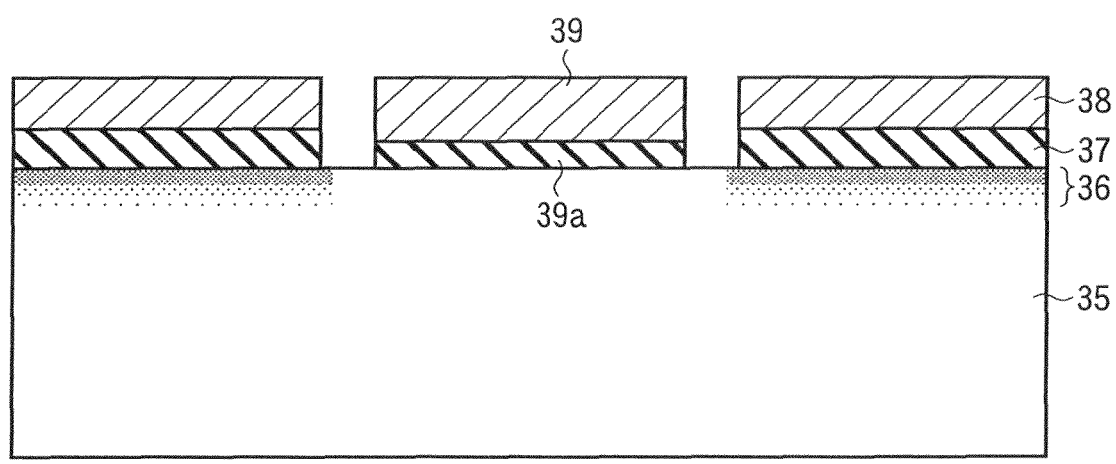
FIG. 2 is a sectional view showing the structure of a spin MOSFET of a second embodiment of the present invention.

A spin MOSFET using a stack having a Heusler alloy of the second embodiment of the present invention will be explained below. FIG. 2 is a sectional view showing the structure of the spin MOSFET of the second embodiment.

As shown in FIG. 2, an impurity diffusion layer 36 as a source or drain portion is formed in the surface region of a semiconductor substrate 35 by ion implantation. A (001)-oriented MgO layer 37 is formed on the impurity diffusion layer 36. An epitaxially grown Heusler alloy 38 is formed on the MgO layer 37. A gate insulating film 39a is formed on the semiconductor substrate 35 between the source and drain. A gate electrode 39 is formed on the gate insulating film 39a.

Figure 3:
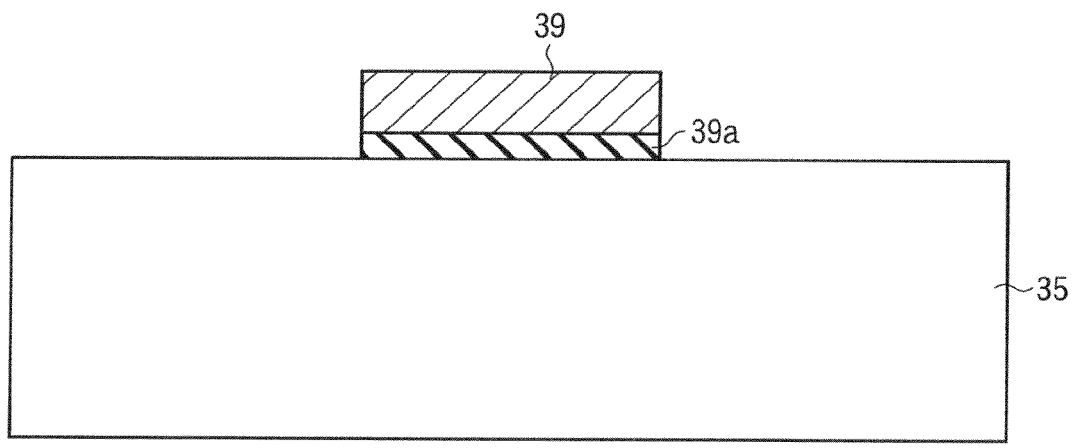
FIG. 3 is a sectional view of a step showing a method of fabricating the spin MOSFET of the second embodiment.

A method of fabricating the spin MOSFET shown in FIG. 2 will be explained below. First, a channel region is formed in the semiconductor substrate 35 by ion implantation and annealing, and a silicon oxide film 39a and polysilicon film 39, for example, are sequentially formed on the semiconductor substrate 35. Then, as shown in FIG. 3, a gate insulating film 39a and gate electrode 39 are formed by etching away the silicon oxide film 39a and polysilicon film 39 from prospective source and drain portions. Subsequently, as shown in FIG. 2, an impurity diffusion layer 36 is formed by ion implantation in the prospective source and drain portions of the surface region of the semiconductor substrate 35. A (001)-oriented MgO layer 37 is formed on the impurity diffusion layer 36 by sputtering. An epitaxially grown Heusler alloy 38 is formed on the MgO layer 37. Then, source and drain electrodes are formed by patterning the MgO layer 37 and Heusler alloy 38 by using, e.g., liftoff, ion milling, or RIE.

Next, the conditions of ion implantation for forming the impurity diffusion layer 36 in the spin MOSFET will be explained below. As an ion candidate to be substituted, it is possible to use, e.g., phosphorus (P), arsenic (As), or boron (B). The projection range is desirably 20 nm or less, and the acceleration voltage is preferably 20 keV or less. The carrier concentration in the impurity diffusion layer 36 is $10^{18}/cm^3$ to $10^{20}/cm^3$. The annealing conditions will now be explained. As the annealing method, normal annealing or rapid thermal annealing (RTA) can be used. Annealing can be performed after the MgO layer 37 is formed, or after the Heusler alloy 38 is formed. Annealing is desirably performed after the MgO layer 37 is formed. When annealing is performed after the MgO layer 37 is formed, the crystallinity, i.e., the orientation of the MgO layer 37 improves. This makes it possible to further improve the crystallinity of the Heusler alloy 38.

Third Embodiment

Figure 4:
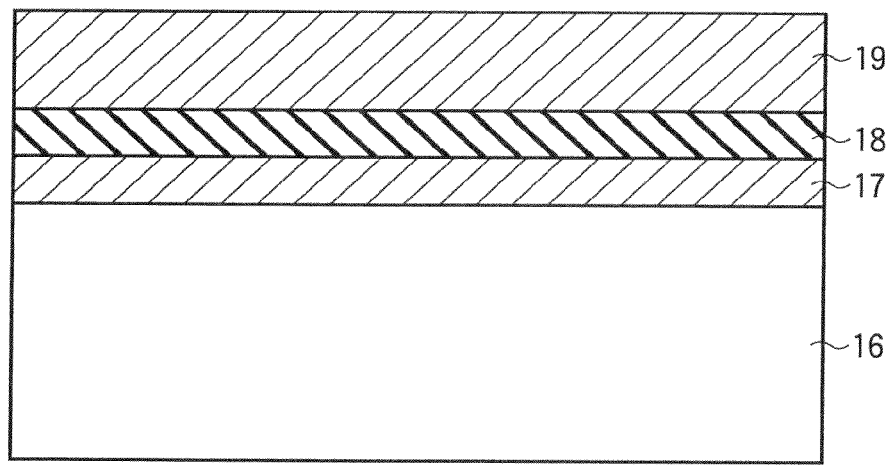
FIG. 4 is a sectional view showing the structure of a stack having a Heusler alloy of a third embodiment of the present invention.

A stack having a Heusler alloy of the third embodiment of the present invention will be explained below. FIG. 4 is a sectional view showing the structure of the stack having a Heusler alloy of the third embodiment.

As shown in FIG. 4, the stack of the third embodiment has a structure obtained by sequentially stacking a nonmagnetic metal amorphous layer 17, (001)-oriented MgO layer 18, and epitaxially grown Heusler alloy 19 on a semiconductor substrate or polycrystalline metal underlying layer 16. More specifically, the nonmagnetic metal amorphous layer 17 is formed on the semiconductor substrate or polycrystalline metal underlying layer 16. The (001)-oriented MgO layer 18 is formed on the nonmagnetic metal amorphous layer 17. The epitaxially grown Heusler alloy 19 is formed on the (001)-oriented MgO layer 18.

In the stack of the third embodiment, the nonmagnetic amorphous layer 17 is formed on the semiconductor substrate or polycrystalline metal underlying layer 16, and the MgO layer 18 is formed on the nonmagnetic metal amorphous layer 17. As a consequence, the MgO layer 18 grows as it is oriented in the (001) plane. The epitaxially grown Heusler alloy 19 is formed on the (001)-oriented MgO layer 18. Accordingly, the epitaxially grown Heusler alloy 19 can be formed on the MgO layer 18. This makes it possible to form the epitaxially grown Heusler alloy 19 on the semiconductor substrate or polycrystalline metal underlying layer 16.

Fourth Embodiment

Figure 5:
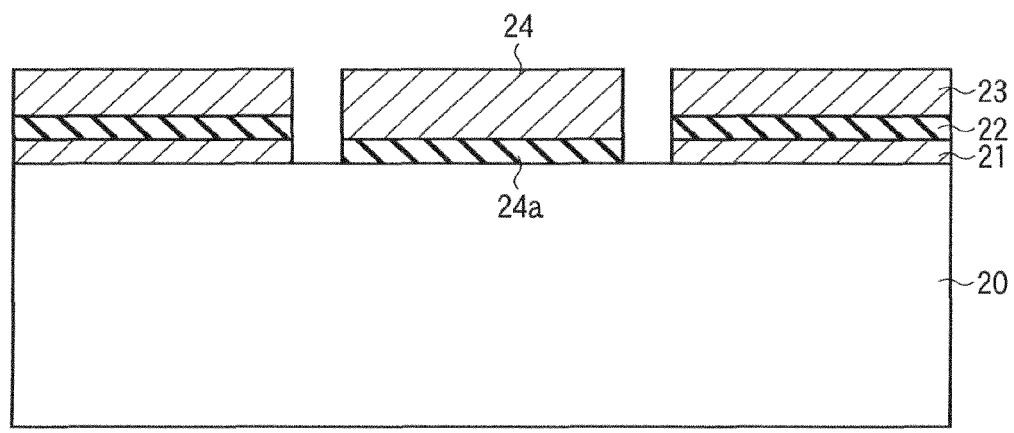
FIG. 5 is a sectional view showing the structure of a spin MOSFET of a fourth embodiment of the present invention.

A spin MOSFET using a stack having a Heusler alloy of the fourth embodiment of the present invention will be explained below. FIG. 5 is a sectional view showing the structure of the spin MOSFET of the fourth embodiment.

As shown in FIG. 5, a nonmagnetic metal amorphous layer 21 as a source or drain portion is formed in the surface region of a semiconductor substrate 20. A (001)-oriented MgO layer 22 is formed on the nonmagnetic metal amorphous layer 21. An epitaxially grown Heusler alloy 23 is formed on the MgO layer 22. A gate insulating film 24a is formed on the semiconductor substrate 20 between the source and drain. A gate electrode 24 is formed on the gate insulating film 24a.

Figure 6:
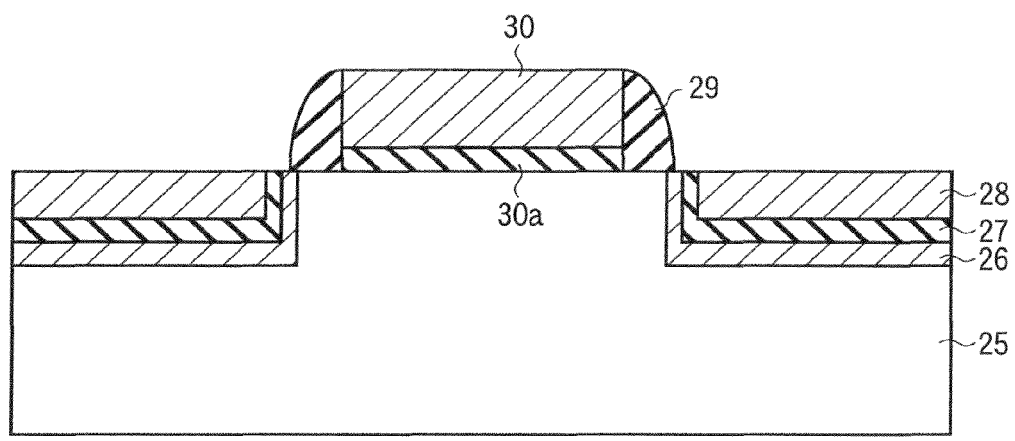
FIG. 6 is a sectional view showing the structure of a buried spin MOSFET of a modification of the fourth embodiment.

Note that the source and drain described above may also be formed by a buried structure as shown in FIG. 6. FIG. 6 is a sectional view showing the structure of a buried spin MOSFET of a modification of the fourth embodiment. As shown in FIG. 6, a nonmagnetic metal amorphous layer 26 is formed in a recessed portion (prospective source or drain portion) formed in a semiconductor substrate 25. A (001)-oriented MgO layer 27 is formed on the nonmagnetic metal amorphous layer 26. An epitaxially grown Heusler alloy 28 is formed on the MgO layer 27. A gate insulating film 30a is formed on the semiconductor substrate 25 between the source and drain. A gate electrode 30 is formed on the gate insulating film 30a. Sidewall films 29 are formed on the side surfaces of the gate electrode 30.

Figure 7:
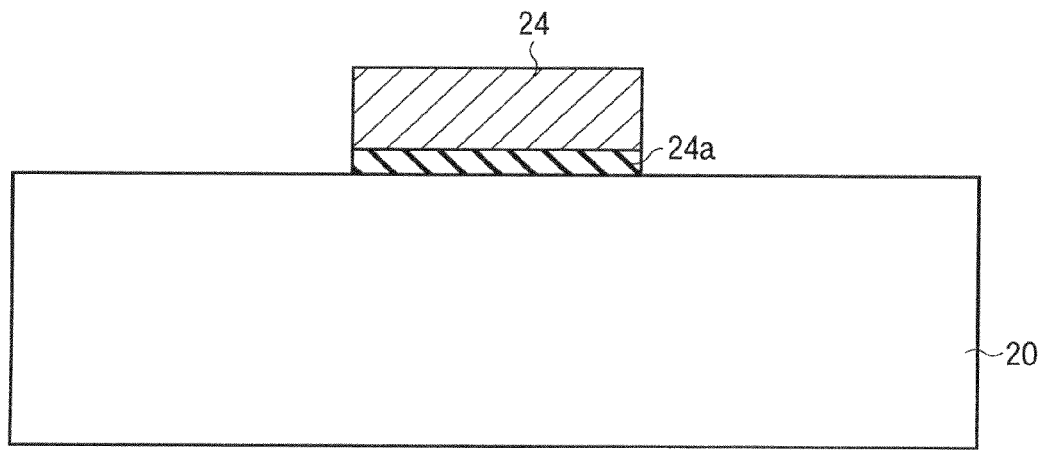
FIG. 7 is a sectional view of a step showing a method of fabricating the spin MOSFET of the fourth embodiment.

A method of fabricating the spin MOSFET shown in FIG. 5 will be explained below. First, a channel region is formed in the semiconductor substrate 20 by ion implantation and annealing, and a silicon oxide film 24a and polysilicon film 24, for example, are sequentially formed on the semiconductor substrate 20. Then, as shown in FIG. 7, a gate insulating film 24a and gate electrode 24 are formed by etching away the silicon oxide film 24a and polysilicon film 24 from prospective source and drain portions. Subsequently, as shown in FIG. 5, a nonmagnetic metal amorphous layer 21 is formed on the prospective source and drain portions of the semiconductor substrate 20. A (001)-oriented MgO layer 22 is formed on the nonmagnetic metal amorphous layer 21. An epitaxially grown Heusler alloy 23 is formed on the MgO layer 22. Then, source and drain electrodes are formed by patterning the nonmagnetic metal amorphous layer 21, MgO layer 22, and Heusler alloy 23 by using, e.g., liftoff, ion milling, or RIE.

Figure 8:
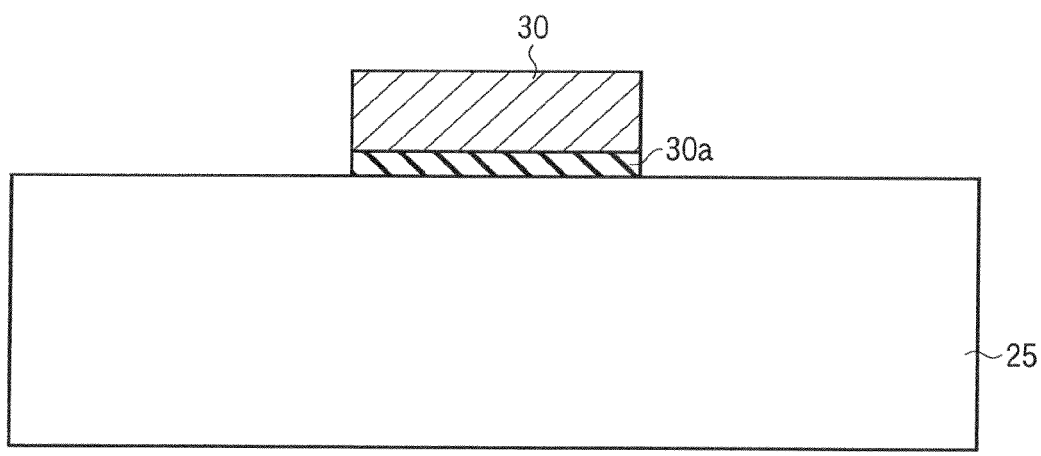
FIG. 8 is a sectional view of a first step showing a method of fabricating the buried spin MOSFET of the modification of the fourth embodiment.
Figure 9:
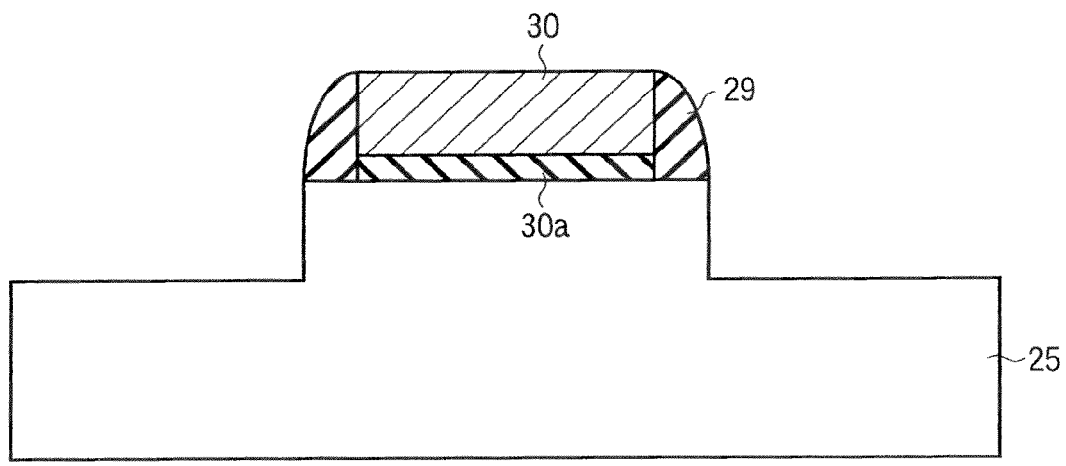
FIG. 9 is a sectional view of a second step showing the method of fabricating the buried spin MOSFET of the modification of the fourth embodiment.

A method of fabricating the spin MOSFET shown in FIG. 6 will now be explained. First, a channel region is formed in the semiconductor substrate 25 by ion implantation and annealing, and a silicon oxide film 30a and polysilicon film 30, for example, are sequentially formed on the semiconductor substrate 25. Then, as shown in FIG. 8, a gate insulating film 30a and gate electrode 30 are formed by etching away the silicon oxide film 30a and polysilicon film 30 from prospective source and drain portions. Subsequently, an insulating film 29 is formed on the semiconductor substrate 25 and gate electrode 30. Sidewall films 29 are formed on the side surfaces of the gate electrode 30 by etching back the insulating film 29. Then, as shown in FIG. 9, recessed portions are formed in the semiconductor substrate 25 by etching away the semiconductor substrate 25 from the prospective source and drain portions.

As shown in FIG. 6, a nonmagnetic metal amorphous layer 26 is formed in the recessed portions of the semiconductor substrate 25. A (001)-oriented MgO layer 27 is formed on the nonmagnetic metal amorphous layer 26. An epitaxially grown Heusler alloy 28 is formed on the MgO layer 27. Subsequently, source and drain electrodes are formed by patterning the nonmagnetic metal amorphous layer 26, MgO layer 27, and Heusler alloy 28 by using, e.g., liftoff, ion milling, or RIE.

In the third and fourth embodiments explained above, as the material of the nonmagnetic metal amorphous layers 17, 21, and 26, it is possible to use a rare earth element such as erbium (Er), ytterbium (Yb), yttrium (Y), gadolinium (Gd), or dysprosium (Dy), or a nonmagnetic element such as silver (Ag), copper (Cu), gold (Au), aluminum (Al), ruthenium (Ru), tantalum (Ta), carbon (C), zirconium (Zr), indium (In), iridium (Ir), tungsten (W), molybdenum (Mo), platinum (Pt), nickel (Ni), or magnesium (Mg).

In the spin MOSFET of the fourth embodiment, spinning carries supplied from the source and drain portions are conducted by tunneling through the MgO (001) layer as a barrier layer. Since the nonmagnetic material is used in the above-mentioned nonmagnetic metal amorphous layer in order to decrease the spin relaxation, the device can function as a spin MOSFET.

Fifth Embodiment

Figure 10:
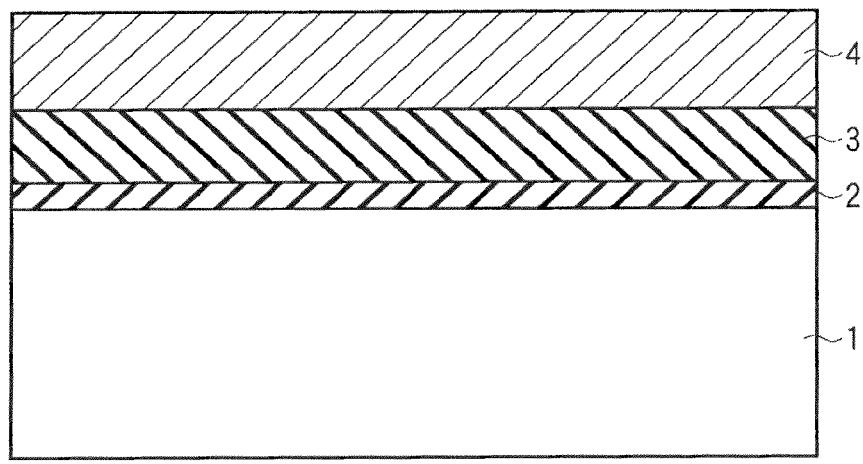
FIG. 10 is a sectional view showing the structure of a stack having a Heusler alloy of a fifth embodiment of the present invention.

A stack having a Heusler alloy of the fifth embodiment of the present invention will be explained below. FIG. 10 is a sectional view showing the structure of the stack having a Heusler alloy of the fifth embodiment.

As shown in FIG. 10, the stack of the fifth embodiment has a structure obtained by sequentially stacking an insulator amorphous layer 2, (001)-oriented MgO layer 3, and epitaxially grown Heusler alloy 4 on a semiconductor substrate or polycrystalline metal underlying layer 1. More specifically, the insulator amorphous layer 2 is formed on the semiconductor substrate or polycrystalline metal underlying layer 1. The (001)-oriented MgO layer 3 is formed on the insulator amorphous layer 2. The epitaxially grown Heusler alloy 4 is formed on the (001)-oriented MgO layer 3.

In the stack of the fifth embodiment, the insulator amorphous layer 2 is formed on the semiconductor substrate or polycrystalline metal underlying layer 1, and the MgO layer 3 is formed on the insulator amorphous layer 2. The present inventors have found that the MgO layer 3 grows as it is oriented in the (001) plane in this case. Also, the Heusler alloy 4 epitaxially grows on the (001)-oriented MgO layer 3. Accordingly, the epitaxially grown Heusler alloy 4 can be formed on the MgO layer 3. This makes it possible to form the epitaxially grown Heusler alloy 4 on the semiconductor substrate or polycrystalline metal underlying layer 1.

Sixth Embodiment

Figure 11:
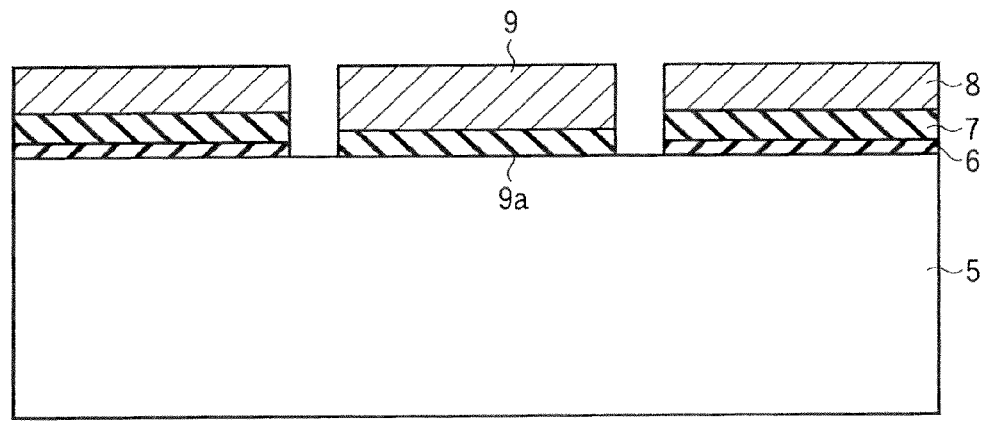
FIG. 11 is a sectional view showing the structure of a spin MOSFET of a sixth embodiment of the present invention.

A spin MOSFET using a stack having a Heusler alloy of the sixth embodiment of the present invention will be explained below. FIG. 11 is a sectional view showing the structure of the spin MOSFET of the sixth embodiment.

As shown in FIG. 11, an insulator amorphous layer 6 as a source or drain portion is formed on a semiconductor substrate 5. A (001)-oriented MgO layer 7 is formed on the insulator amorphous layer 6. An epitaxially grown Heusler alloy 8 is formed on the MgO layer 7. A gate insulating film 9a is formed on the semiconductor substrate 5 between the source and drain. A gate electrode 9 is formed on the gate insulating film 9a.

Figure 12:
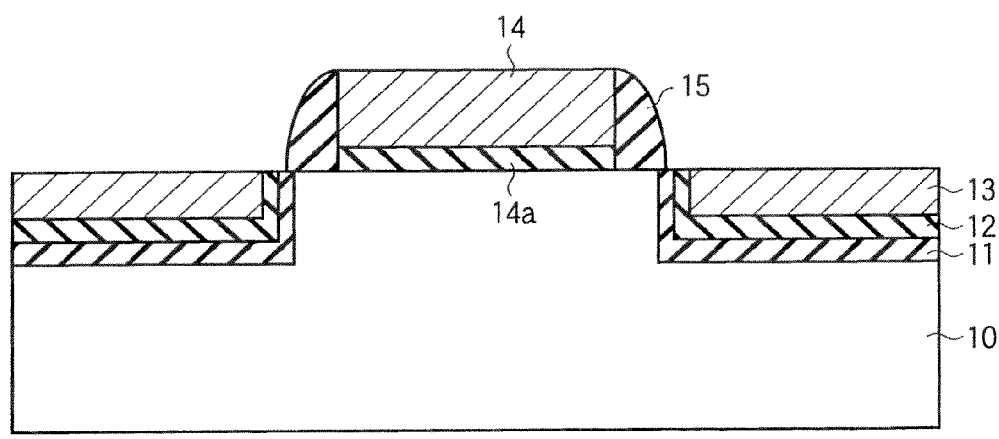
FIG. 12 is a sectional view showing the structure of a buried spin MOSFET of a modification of the sixth embodiment of the present invention.

Note that the source and drain described above may also be formed by a buried structure as shown in FIG. 12. FIG. 12 is a sectional view showing the structure of a buried spin MOSFET of a modification of the sixth embodiment. As shown in FIG. 12, an insulator amorphous layer 11 is formed in a recessed portion (prospective source or drain portion) formed in a semiconductor substrate 10. A (001)-oriented MgO layer 12 is formed on the insulator amorphous layer 11. An epitaxially grown Heusler alloy 13 is formed on the MgO layer 12. A gate insulating film 14a is formed on the semiconductor substrate 10 between the source and drain. A gate electrode 14 is formed on the gate insulating film 14a. Sidewall films 15 are formed on the side surfaces of the gate electrode 14.

Figure 13:
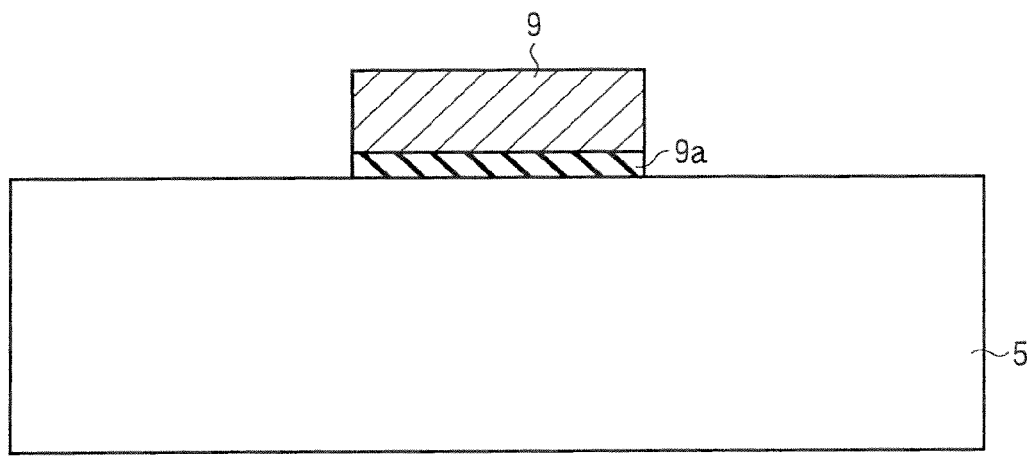
FIG. 13 is a sectional view of a step showing a method of fabricating the spin MOSFET of the sixth embodiment.

A method of fabricating the spin MOSFET shown in FIG. 11 will be explained below. First, a channel region is formed in the semiconductor substrate 5 by ion implantation and annealing, and a silicon oxide film 9a and polysilicon film 9, for example, are sequentially formed on the semiconductor substrate 5. Then, as shown in FIG. 13, a gate insulating film 9a and gate electrode 9 are formed by etching away the silicon oxide film 9a and polysilicon film 9 from prospective source and drain portions. Subsequently, as shown in FIG. 11, a insulator amorphous layer 6 is formed on the prospective source and drain portions of the semiconductor substrate 5. A (001)-oriented MgO layer 7 is formed on the insulator amorphous layer 6. An epitaxially grown Heusler alloy 8 is formed on the MgO layer 7. Then, source and drain electrodes are formed by patterning the insulator amorphous layer 6, MgO layer 7, and Heusler alloy 8 by using, e.g., liftoff, ion milling, or RIE.

Figure 14:
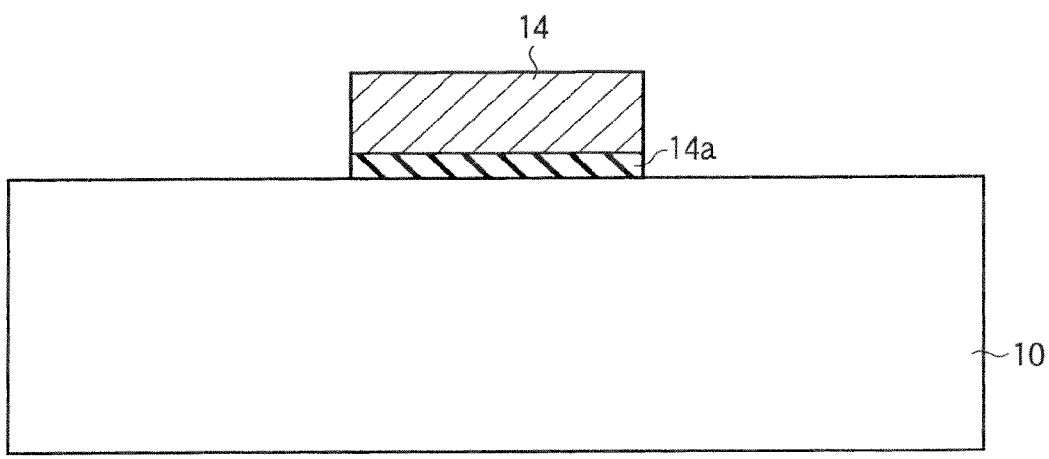
FIG. 14 is a sectional view of a first step showing a method of fabricating the buried spin MOSFET of the modification of the sixth embodiment.
Figure 15:
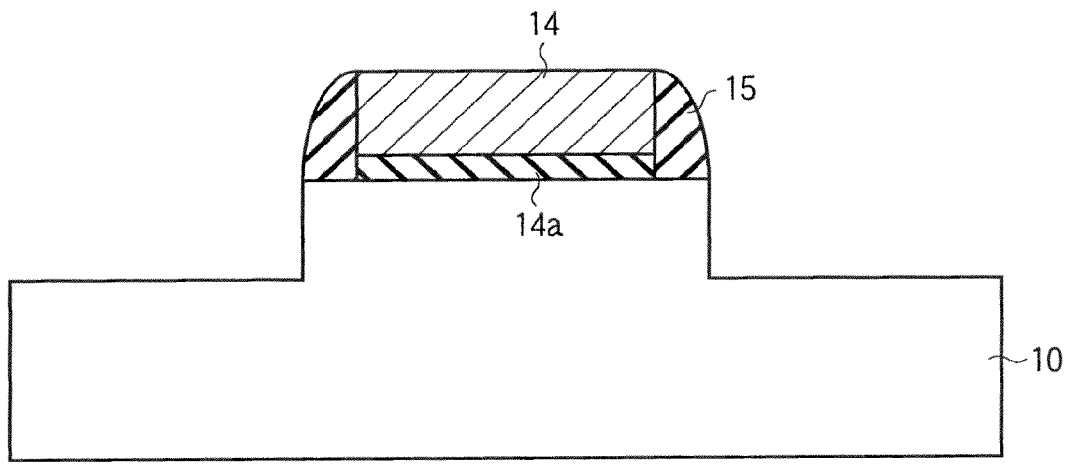
FIG. 15 is a sectional view of a second step showing the method of fabricating the buried spin MOSFET of the modification of the sixth embodiment.

A method of fabricating the spin MOSFET shown in FIG. 12 will now be explained. First, a channel region is formed in the semiconductor substrate 10 by ion implantation and annealing, and a silicon oxide film 14a and polysilicon film 14, for example, are sequentially formed on the semiconductor substrate 10. Then, as shown in FIG. 14, a gate insulating film 14a and gate electrode 14 are formed on the semiconductor substrate 10 by etching away the silicon oxide film 14a and polysilicon film 14 from prospective source and drain portions. Subsequently, an insulating film 15 is formed on the semiconductor substrate 10 and gate electrode 14. Sidewall films 15 are formed on the side surfaces of the gate electrode 14 by etching back the insulating film 15. Then, as shown in FIG. 15, recessed portions are formed in the semiconductor substrate 10 by etching away the semiconductor substrate 10 from the prospective source and drain portions.

As shown in FIG. 12, an insulator amorphous layer 11 is formed in the recessed portions of the semiconductor substrate 10. A (001)-oriented MgO layer 12 is formed on the insulator amorphous layer 11. An epitaxially grown Heusler alloy 13 is formed on the MgO layer 12. Subsequently, source and drain electrodes are formed by patterning the insulator amorphous layer 11, MgO layer 12, and Heusler alloy 13 by using, e.g., liftoff, ion milling, or RIE.

In the fifth and sixth embodiments explained above, as the material of the insulator amorphous layers 2, 6, and 11, it is possible to use any of various insulators such as magnesium oxide, silicon oxide, aluminum oxide, aluminum nitride, bismuth oxide, magnesium fluoride, calcium fluoride, strontium titanate, lanthanum aluminate, aluminum oxynitride, and hafnium oxide.

The total film thickness of the insulator amorphous layers 2, 6, and 11 and MgO (001) layers 3, 7, and 12 serving as barrier layers is desirably a film thickness by which no spin relaxation of carriers occurs and tunneling of the carriers is possible, i.e., desirably 3 nm or less much smaller than the spin diffusion length.

In the spin MOSFET of the sixth embodiment, the insulator amorphous layers 6 and 11 are preferably thinner than 5 nm, and more preferably, thinner than 3 nm in order to increase the mobility. Especially when writing information by using spin transfer torque, the film thickness must be 1.2 nm or less in order to prevent tunnel barrier breakdown.

Seventh Embodiment

Figure 16:
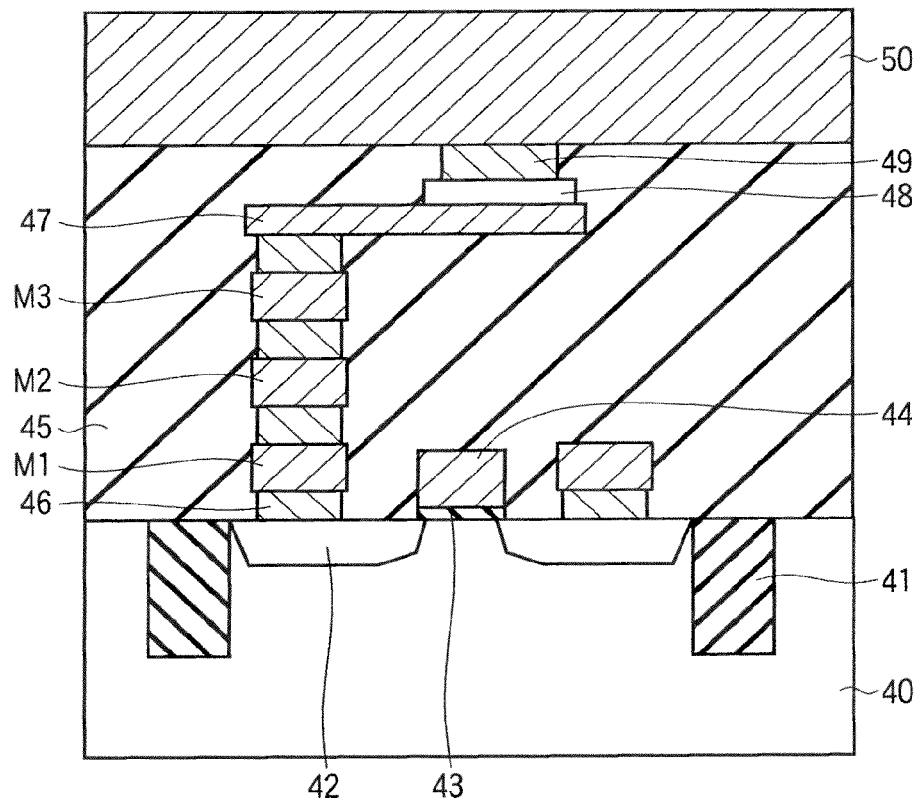
FIG. 16 is a sectional view showing the structure of a memory cell of an MRAM according to a seventh embodiment of the present invention.

An MRAM of the seventh embodiment of the present invention will be explained below. In a memory cell of this MRAM, a stack having a Heusler alloy is used as a magnetic tunnel junction (MTJ) element. FIG. 16 is a sectional view showing the structure of the memory cell of the MRAM of the seventh embodiment.

As shown in FIG. 16, the memory cell of the MRAM of the seventh embodiment has a structure in which an electrode layer, polycrystalline metal underlying interconnection 47, MTJ element 48, and metal via (or metal hard mask) 49 are sequentially formed on a transistor formed on a semiconductor substrate 40, and a bit line 50 is formed on the metal via (or metal hard mask) 49.

The structure of the memory cell of the MRAM will be described in detail below. Element isolation regions 41 are formed in the semiconductor substrate 40, and source and drain regions 42 are formed in the semiconductor substrate sandwiched between the element isolation regions 41. A gate insulating film 43 is formed on the semiconductor substrate 40 between the source and drain regions. A gate electrode 44 is formed on the gate insulating film 43. An interlayer dielectric film 45 is formed on the semiconductor substrate 40. In the interlayer dielectric film 45 on the source or drain region 42, first, second, and third interconnections M1, M2, and M3 are sequentially formed with contact plugs 46 interposed between them. The polycrystalline metal underlying interconnection 47 is formed on the contact plug 46 on the third interconnection M3. The MTJ element 48 is formed on the polycrystalline metal underlying interconnection 47. The metal via (or metal hard mask) 49 is formed on the MTJ element 48. The bit line 50 is formed on the metal via 49.

The MTJ element 48 has a structure in which an amorphous layer (nonmagnetic metal amorphous layer or insulator amorphous layer) 51 is formed on the polycrystalline metal underlying interconnection 47, and a (001)-oriented MgO layer 52 and an epitaxially grown Heusler alloy/tunnel barrier/Heusler alloy are sequentially stacked.

Figure 17A:
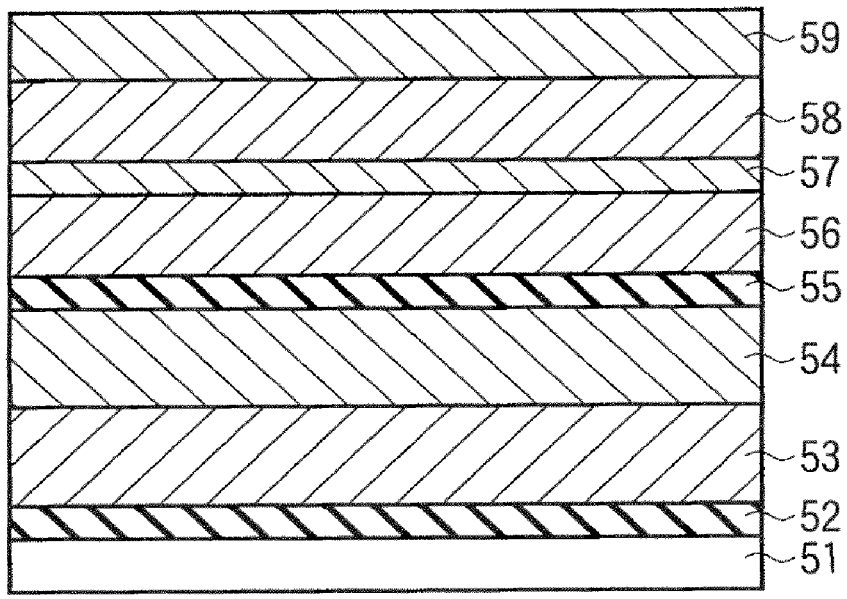
FIGS. 17A and 17B are sectional views each showing the structure of an MTJ element in the memory cell of the seventh embodiment.
Figure 17B:
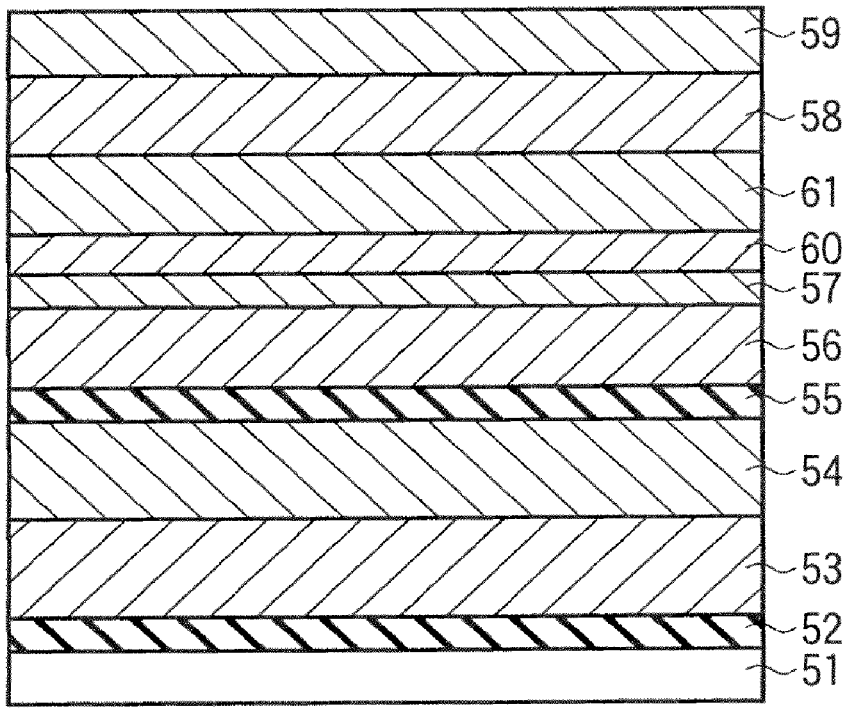

FIG. 17A or 17B shows details of the sectional structure of the MTJ element 48. As shown in FIG. 17A, the MgO layer 52 is formed on the amorphous layer 51, and a metal layer (body-centered cubic lattice [bcc] underlying layer) 53 having a bcc structure is formed on the MgO layer 52. A Heusler alloy 54, tunnel barrier layer (e.g., MgO layer) 55, Heusler alloy 56, CoFe layer 57, antiferromagnetic layer 58, and cap layer 59 are sequentially formed on the bcc underlying layer 53. As shown in FIG. 17B, another sectional structure of the MTJ element 48 is obtained by sequentially forming an MgO layer 52, bcc underlying layer 53, Heusler alloy 54, tunnel barrier layer (e.g., MgO layer) 55, Heusler alloy 56, CoFe layer 57, Ru layer 60, CoFe layer 61, antiferromagnetic layer 58, and cap layer 59 on an amorphous layer 51.

To improve the crystallinity of the Heusler alloy 54, the metal layer 53 having the body-centered cubic lattice (bcc) structure as described above is formed in the interface between the (001)-oriented MgO layer 52 and epitaxially grown Heusler alloy 54. As the metal layer 53 having the bcc structure, it is possible to use chromium (Cr), iron (Fe), vanadium (V), niobium (Nb), molybdenum (Mo), tantalum (Ta), tungsten (W), or an alloy of any of these metals. Note that the metal layer 53 having the body-centered cubic lattice structure is not always necessary, and the epitaxially grown Heusler alloy 54 may also be directly formed on the (001)-oriented MgO layer 52.

Eighth Embodiment

A TMR head of the eighth embodiment of the present invention will be explained below. This TMR head is formed by using an MTJ element, and used in a hard disk drive (HDD). FIGS. 18A and 18B are sectional views each showing the structure of the TMR head of the eighth embodiment.

As shown in FIG. 18A or 18B, the TMR head has a structure in which the MTJ element is sandwiched between a lower electrode layer 70 and upper electrode layer 79. The MTJ element has a structure in which an amorphous layer (nonmagnetic metal amorphous layer or insulator amorphous layer) 71, (001)-oriented MgO layer 72, and epitaxially grown Heusler alloy 73 are sequentially stacked on the lower electrode layer 70. More specifically, as shown in FIG. 18A, the amorphous layer 71, the MgO layer 72, the Heusler alloy 73, a tunnel barrier layer (e.g., an MgO layer) 74, a Heusler alloy 75, a CoFe layer 76, an antiferromagnetic layer 77, and a cap layer 78 are sequentially formed on the lower electrode layer (magnetic shield layer) 70. The upper electrode layer (magnetic shield layer) 79 is formed on the cap layer 78.

To improve the crystallinity of the Heusler alloy 73, as shown in FIG. 18B, a metal layer 80 having a body-centered cubic lattice (bcc) structure may also be formed in the interface between the (001)-oriented MgO layer 72 and epitaxially grown Heusler alloy 73. As the metal layer 80 having the bcc structure, it is possible to use, e.g., chromium (Cr), iron (Fe), vanadium (V), niobium (Nb), molybdenum (Mo), tantalum (Ta), or tungsten (W).

In the seventh and eighth embodiments explained above, the total film thickness of the insulator amorphous layers 51 and 71 and MgO (001) layers 52 and 72 serving as barrier layers is desirably a film thickness by which no spin relaxation of carriers occurs and tunneling of the carriers is possible, i.e., desirably 3 nm or less much smaller than the spin diffusion length.

In each embodiment described above, the semiconductor substrate is a substrate having an Si single crystal, Ge single crystal, or Si—Ge single crystal, or a silicon-on-insulator (SOI) substrate. The insulator amorphous layer is made of, e.g., MgO, $SiO_2$, $Al_2O_3$, AlN, $BiO_3$, $MgF_2$, $CaF_2$, $SrTiO_3$, $LaAlO_3$, Al—N—O, or HfO. The nonmagnetic metal amorphous layer is made of a rare earth element such as Er, Yb, Y, Gd, or Dy, or a nonmagnetic element such as Ag, Cu, Au, Al, Ru, Ta, C, Zr, In, Ir, W, Mo, Pt, Ni, or Mg.

The present invention will be explained in more detail below by way of its examples.

Example 1

As Example 1 of the present invention, a stack having a Heusler alloy was manufactured. The procedure of the manufacture will be described below. FIG. 19 is a sectional view showing the structure of the stack having a Heusler alloy of Example 1.

A native oxide film ($SiO_2$) 65 as an amorphous layer was formed on a (001)-oriented silicon semiconductor single-crystal substrate 64. Sputter cleaning was performed on the native oxide film 65 on the silicon substrate 64, thereby cleaning the surface of the native oxide film 65. Then, a 5-nm-thick MgO layer 66 was formed on the native oxide film 65 by sputtering. In addition, a 10-nm-thick Heusler alloy 67 made of $CO_2FeAl_{0.5}Si_{0.5}$ was formed on the MgO layer 66 by sputtering.

Figure 20A:
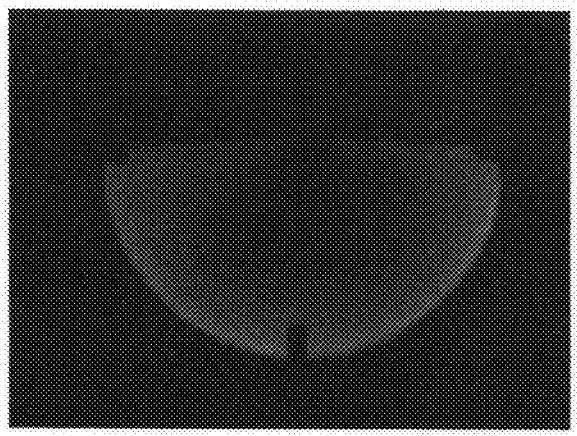
FIGS. 20A to 20C are views showing reflection high-energy electron diffraction images in the stack of Example 1.
Figure 20B:
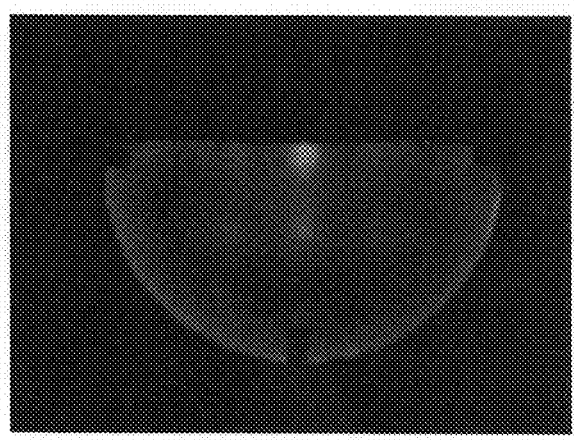
Figure 20C:
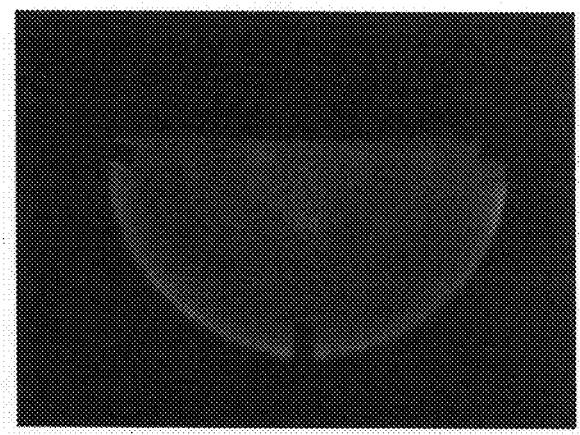

In the stack of Example 1 manufactured following the above procedure, a reflection high-energy electron diffraction (RHEED) image of each layer was observed by the electron beam diffraction method. FIG. 20A shows the RHEED image of the native oxide film ($SiO_2$) 65. FIG. 20B shows the RHEED image of the MgO layer 66. FIG. 20C shows the RHEED image of the $CO_2FeAl_{0.5}Si_{0.5}$ Heusler alloy 67. FIG. 20A shows that the native oxide film 65 was in an amorphous state. FIG. 20B shows that the MgO layer 66 formed on the native oxide film 65 had a (001)-oriented structure. FIG. 20C shows that the $CO_2FeAl_{0.5}Si_{0.5}$ Heusler alloy 67 formed on the MgO layer 66 had an epitaxially grown structure.

Accordingly, Example 1 reveals that an epitaxially grown Heusler alloy can be formed on a semiconductor substrate. Note that in Example 1, the Heusler alloy 67 was formed on the MgO layer 66 on the native oxide ($SiO_2$) film 65 formed on the semiconductor substrate 64. However, the same result was obtained even when a Heusler alloy was formed on an MgO layer on an $Al_2O_x$ film formed on a semiconductor substrate. Also, an impurity diffusion layer was formed in a semiconductor substrate by ion implantation or ion milling using Ar or the like, and an MgO layer and Heusler alloy were sequentially formed on this impurity diffusion layer. Consequently, it was possible to obtain a good stacked film including the MgO layer and Heusler alloy in this case as well.

Example 2

As Example 2 of the present invention, a stack having a Heusler alloy as shown in FIG. 21 was manufactured. The procedure of the manufacture will be described below. FIG. 21 is a sectional view showing the structure of the stack having a Heusler alloy of Example 2.

First, a native oxide film on a (001)-oriented silicon semiconductor single-crystal substrate 81 was removed by a hydrofluoric acid treatment. Then, a rare earth metal film, e.g., a 3-nm-thick erbium (Er) layer 82 was formed by sputtering. A 2-nm-thick MgO layer 83 was formed on the Er layer 82, and a 10-nm-thick $CO_2FeAl_{0.5}Si_{0.5}$ Heusler alloy 84 was formed on the MgO layer 83.

Figure 22A:
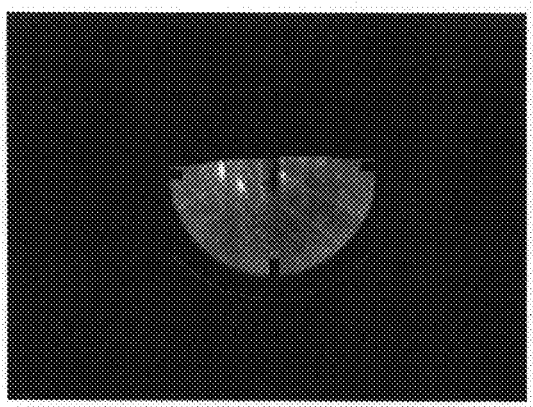
FIGS. 22A to 22D are views showing reflection high-energy electron diffraction images in the stack of Example 2.
Figure 22B:
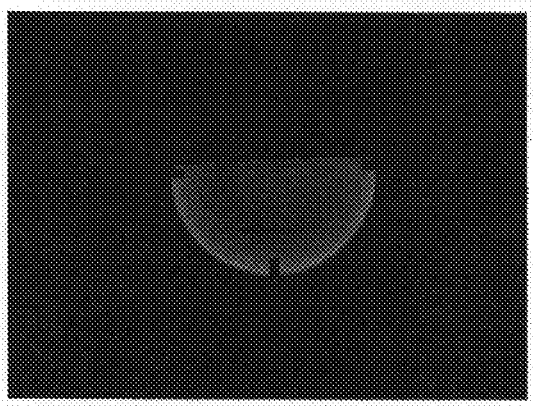
Figure 22C:
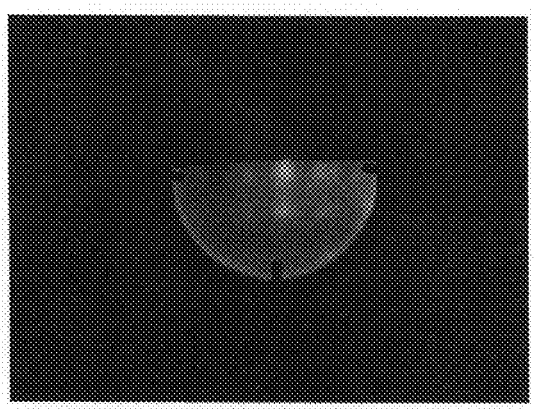
Figure 22D:
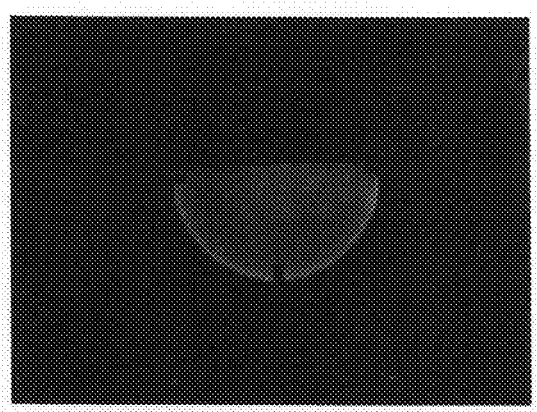

In the stack of Example 2 manufactured following the above procedure, an RHEED image of each layer was observed by the electron beam diffraction method. FIG. 22A shows the RHEED image of the surface of the (001)-oriented silicon semiconductor substrate 81. FIG. 22B shows the RHEED image of the Er layer 82. FIG. 22C shows the RHEED image of the MgO layer 83. FIG. 22D shows the RHEED image of the $CO_2FeAl_{0.5}Si_{0.5}$ Heusler alloy 84. FIG. 22A shows that the crystallinity of the surface of the (001)-oriented silicon semiconductor substrate 81 was very high. FIG. 22B shows that the Er layer 82 formed on the (001)-oriented semiconductor substrate 81 was in an amorphous state. FIG. 22C shows that the MgO layer 83 formed on the Er layer 82 had a (001)-oriented structure. FIG. 22D shows that the $CO_2FeAl_{0.5}Si_{0.5}$ Heusler alloy 84 formed on the MgO layer 83 had an epitaxially grown structure.

Accordingly, Example 2 reveals that an epitaxially grown Heusler alloy can be formed on a semiconductor substrate. Note that in Example 2, the erbium (Er) layer 82 was formed as a nonmagnetic metal amorphous layer on the semiconductor substrate 81, and the Heusler alloy 84 was formed on the MgO layer 83 on the erbium (Er) layer 82. Moreover, the same result was obtained even when a rare earth metal layer made of, e.g., ytterbium (Yb) or yttrium (Y) was formed as a nonmagnetic metal amorphous layer on a semiconductor substrate, and a Heusler alloy was formed on an MgO layer on the ytterbium (Yb) or yttrium (Y) layer.

The embodiments of the present invention make the fabrication of a spin MOSFET using a Heusler alloy feasible, and are very useful to implement a spin MOSFET having a high TMR ratio.

The embodiments of the present invention can provide a stack having an epitaxially grown Heusler alloy on a semiconductor layer, and semiconductor devices such as a spin MOS field effect transistor and tunneling magnetoresistive effect element using the stack having a Heusler alloy.

The above-mentioned embodiments can be practiced singly or in the form of an appropriate combination. Also, these embodiments include inventions in various stages. Accordingly, inventions in various stages can also be extracted by appropriately combining constituent elements disclosed in the embodiments.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A spin MOS field effect transistor comprising a source electrode and a drain electrode each having a structure obtained by stacking:
   a nonmagnetic metal amorphous layer formed on a semiconductor layer;
   a (001)-oriented MgO layer formed on the nonmagnetic metal amorphous layer; and
   a Heusler alloy formed on the MgO layer.

2. The transistor according to claim 1, wherein the semiconductor layer is made of a material selected from the group consisting of Si, Ge, and Si—Ge.

3. The transistor according to claim 1, wherein the nonmagnetic metal amorphous layer contains at least one of a rare earth element selected from the group consisting of erbium (Er), ytterbium (Yb), yttrium (Y), gadolinium (Gd), and dysprosium (Dy), and a nonmagnetic element selected from the group consisting of silver (Ag), copper (Cu), gold (Au), aluminum (Al), ruthenium (Ru), tantalum (Ta), carbon (C), zirconium (Zr), indium (In), iridium (Ir), tungsten (W), molybdenum (Mo), platinum (Pt), nickel (Ni), and magnesium (Mg).

* * * * *